US012771368B2

(12) United States Patent
Bupathy Sudan et al.

(10) Patent No.: US 12,771,368 B2
(45) Date of Patent: Oct. 20, 2026

(54) BOOTSTRAPPED COMPARATOR

(71) Applicant: Cirrus Logic International Semiconductor Ltd., Edinburgh (GB)

(72) Inventors: Rohit Bupathy Sudan, Austin, TX (US); Ravi K. Kummaraguntla, Austin, TX (US); Rakesh Selvaraj, Austin, TX (US)

(73) Assignee: Cirrus Logic Inc., Austin, TX (US)

( * ) Notice: Subject to any disclaimer, the term of this patent is extended or adjusted under 35 U.S.C. 154(b) by 117 days.

(21) Appl. No.: 18/628,077

(22) Filed: Apr. 5, 2024

(65) Prior Publication Data

US 2025/0317151 A1 Oct. 9, 2025

(51) Int. Cl.

*H03M 1/00* (2006.01)
*H03M 1/12* (2006.01)
*H03M 1/42* (2006.01)
*H03M 1/46* (2006.01)

(52) U.S. Cl.

CPC ........... *H03M 1/1245* (2013.01); *H03M 1/42* (2013.01); *H03M 1/462* (2013.01)

(58) Field of Classification Search

CPC . H03K 5/24; H03K 7/06; H03M 1/12; H03M 1/001; H03M 1/06; H03M 1/0607; H03M 1/0836; H03M 1/0872; H03M 1/10; H03M 1/1085; H03M 1/1245; H03M 1/181; H03M 1/468; H03M 1/60; H03M 1/62; H03M 1/66; H03M 1/742; H03M 1/804; H03M 3/02; H03M 3/30; H03M 3/37; H03M 3/448; H03M 3/464

USPC ........ 341/118, 120, 161, 164, 165, 135, 136

See application file for complete search history.

(56) References Cited

U.S. PATENT DOCUMENTS

| | | | | |
|---|---|---|---|---|
| 7,626,843 | B2 * | 12/2009 | Yan | G11C 11/405 365/72 |
| 9,438,258 | B1 * | 9/2016 | Yoo | H03M 1/145 |
| 10,727,859 | B1 * | 7/2020 | Agrawal | H03M 3/37 |
| 11,088,701 | B1 * | 8/2021 | Paul | H03M 1/001 |

(Continued)

FOREIGN PATENT DOCUMENTS

EP 3496275 A1 6/2019

OTHER PUBLICATIONS

International Search Report and Written Opinion of the International Searching Authority, International Application No. PCT/US2025/020567, mailed Jul. 3, 2025.

(Continued)

*Primary Examiner* — Linh V Nguyen

(74) *Attorney, Agent, or Firm* — Jackson Walker L.L.P.

(57) ABSTRACT

A successive approximation register analog-to-digital converter may include a reference digital-to-analog converter, a successive approximation register, and a top-plate sampled comparator configured to compare a reference signal generated by the reference digital-to-analog converter to an analog input signal in order to generate a comparator output to the successive approximation register. The top-plate sampled comparator may include sampling transistors, sampling switches, non-linear capacitors, and circuitry configured to pre-condition the comparator by maintaining a constant voltage across non-linear capacitors of the top-plate sampled comparator during a sampling phase of the comparator in order to maintain sampling linearity of the top-plate sampled comparator.

15 Claims, 3 Drawing Sheets

(56) References Cited

U.S. PATENT DOCUMENTS

| | | | | |
|---|---|---|---|---|
| 2015/0123832 | A1* | 5/2015 | Sohn | H03K 5/1252 327/56 |
| 2019/0035834 | A1* | 1/2019 | Kim | H03M 1/002 |
| 2019/0115931 | A1* | 4/2019 | Hurwitz | H03M 1/123 |
| 2020/0204184 | A1* | 6/2020 | Rattan | H03K 3/356191 |
| 2020/0280693 | A1* | 9/2020 | Kim | H04N 25/00 |
| 2024/0259713 | A1* | 8/2024 | Park | H03M 1/56 |

OTHER PUBLICATIONS

Luo, Jian et al., "A 0.9-V 12-bit 100-MS/s 14.6-fJ/Conversion-Step SAR ADC in 40-nm CMOS", IEEE Transactions on Very Large Scale Integration (VLSI) Systems, vol. 26, No. 10, Jul. 3, 2018, pp. 1980-1988.

Runge, Marcel et al., "A 0.02-mm2 9-bit 100-MS/s Charge-Injection Cell Based SAR-ADC in 65-nm LP CMOS", IEEE 44th European Solid State Circuits Conference, IEEE, Sep. 3, 2018, pp. 26-29.

* cited by examiner

BOOTSTRAPPED COMPARATOR

FIELD OF DISCLOSURE

The present disclosure relates in general to signal processing systems, and more particularly, to a bootstrapped comparator which may be used, for example, in a successive approximation register analog-to-digital converter.

BACKGROUND

An analog-to-digital converter (ADC) is a circuit that converts an analog waveform into a discrete digital representation of the analog waveform. A successive approximation register ADC (SAR ADC) is a type of ADC that converts an analog waveform into a discrete digital representation via a binary search through all possible quantization levels of the digital output of the SAR ADC before finally converging upon a digital output for each conversion.

All ADCs require some sort of sampling of an input signal of the analog waveform that is to be converted into an equivalent digital signal. Such sampling often involves sampling the analog waveform onto a capacitor and comparing the sampled signal to a reference signal in order to quantize the analog signal into a digital signal. One type of sampling system often employed in ADCs is a top-plate sampling system.

In typical top-plate sampling systems, an analog input signal may be directly sampled on the input of a comparator. For low-resolution ADCs, such approach is often suitable. However, for medium- to high-resolution SAR ADCs, the input may be sampled onto the gate of a transistor (e.g., in which the gate capacitance serves as the sampling capacitor). However, the gate capacitance of a transistor may be highly non-linear, which may result in total harmonic distortion in the sampling circuit.

SUMMARY

In accordance with the teachings of the present disclosure, certain disadvantages and problems associated with implementation of comparators in ADC circuits may be reduced or eliminated.

In accordance with embodiments of the present disclosure, a method for maintaining sampling linearity in a top-plate sampled comparator may include pre-conditioning the comparator by maintaining a constant voltage across non-linear capacitors of the comparator during a sampling phase of the comparator.

In accordance with these and other embodiments of the present disclosure, a top-plate sampled comparator may include sampling transistors, sampling switches, non-linear capacitors, and circuitry configured to pre-condition the comparator by maintaining a constant voltage across non-linear capacitors of the top-plate sampled comparator during a sampling phase of the comparator in order to maintain sampling linearity of the top-plate sampled comparator.

In accordance with these and other embodiments of the present disclosure, a successive approximation register analog-to-digital converter may include a reference digital-to-analog converter, a successive approximation register, and a top-plate sampled comparator configured to compare a reference signal generated by the reference digital-to-analog converter to an analog input signal in order to generate a comparator output to the successive approximation register. The top-plate sampled comparator may include sampling transistors, sampling switches, non-linear capacitors, and circuitry configured to pre-condition the comparator by maintaining a constant voltage across non-linear capacitors of the top-plate sampled comparator during a sampling phase of the comparator in order to maintain sampling linearity of the top-plate sampled comparator.

Technical advantages of the present disclosure may be readily apparent to one having ordinary skill in the art from the figures, description and claims included herein. The objects and advantages of the embodiments will be realized and achieved at least by the elements, features, and combinations particularly pointed out in the claims.

It is to be understood that both the foregoing general description and the following detailed description are explanatory examples and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
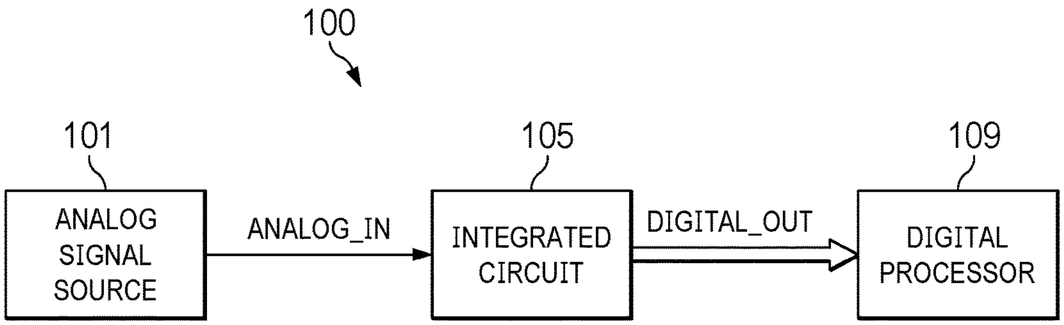
FIG. 1 illustrates a block diagram of selected components of an example signal processing system, in accordance with embodiments of the present disclosure.

FIG. 1 illustrates a block diagram of selected components of an example signal processing system 100, in accordance with embodiments of the present disclosure. As shown in FIG. 1, signal processing system 100 may include an analog signal source 101, an integrated circuit (IC) 105, and a digital processor 109. Analog signal source 101 may comprise any system, device, or apparatus configured to generate an analog electrical signal, for example an analog input signal ANALOG_IN. For example, in embodiments in which signal processing system 100 is a processing system, analog signal source 101 may comprise a microphone transducer.

Integrated circuit 105 may comprise any suitable system, device, or apparatus configured to process analog input signal ANALOG_IN to generate a digital output signal DIGITAL_OUT and condition digital output signal DIGITAL_OUT for transmission over a bus to digital processor 109. Once converted to digital output signal DIGITAL_OUT, the signal may be transmitted over significantly longer distances without being susceptible to noise as compared to an analog transmission over the same distance. In some embodiments, integrated circuit 105 may be disposed in close proximity with analog signal source 101 to ensure that the length of the analog line between analog signal source 101 and integrated circuit 105 is relatively short to minimize the amount of noise that can be picked up on an analog output line carrying analog input signal ANALOG_IN. For example, in some embodiments, analog signal source 101 and integrated circuit 105 may be formed on the same substrate. In other embodiments, analog signal source 101 and integrated circuit 105 may be formed on different substrates packaged within the same integrated circuit package.

Digital processor 109 may comprise any suitable system, device, or apparatus configured to process a digital output signal for use in a digital system. For example, digital processor 109 may comprise a microprocessor, microcontroller, digital signal processor (DSP), application specific integrated circuit (ASIC), or any other device configured to interpret and/or execute program instructions and/or process data, such as digital output signal DIGITAL_OUT.

Signal processing system 100 may be used in any application in which it is desired to process an analog signal to generate a digital signal. Thus, in some embodiments, signal processing system 100 may be integral to an audio device that converts analog signals (e.g., from a microphone) to digital signals representing the sound incident on a microphone. As another example, signal processing system 100 may be integral to a radio-frequency device (e.g., a mobile telephone) to convert radio-frequency analog signals into digital signals.

Figure 2:
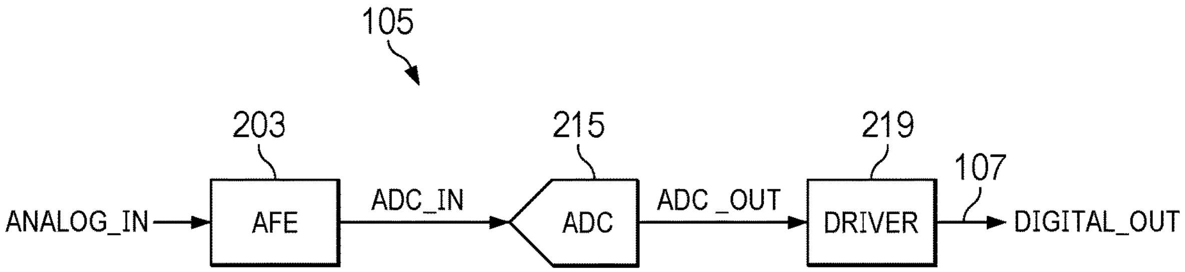
FIG. 2 illustrates a block diagram of selected components of an integrated circuit for processing an analog signal to generate a digital signal, in accordance with embodiments of the present disclosure.

FIG. 2 illustrates a block diagram of selected components of integrated circuit 105, in accordance with embodiments of the present disclosure. As shown in FIG. 2, integrated circuit 105 may include a processing path having a respective analog front end (AFE) 203, an ADC 215, and a driver 219. AFE 203 may receive analog input signal ANALOG_IN via one or more input lines which may allow for receipt of a single-ended signal, differential signal, or any other suitable analog signal format and may comprise any suitable system, device, or apparatus configured to condition analog input signal ANALOG_IN for processing by ADC 215. An example of signal ANALOG_IN may be an analog electrical signal generated by an electronic sensor (e.g., a microphone, a temperature sensor, a positional sensor, etc.). AFE 203 may generate an ADC input signal ADC_IN which may be communicated to ADC 215 on one or more output lines.

ADC 215 may comprise any suitable system, device, or apparatus configured to convert an analog ADC input signal ADC_IN received at its input, to a digital signal ADC_OUT representative of analog input signal ANALOG_IN. ADC 215 may itself include one or more components (e.g., delta-sigma modulator, decimator, etc.) for carrying out the functionality of ADC 215. In some embodiments, ADC 215 may comprise a SAR ADC. Selected components for the example embodiments of ADC 215 are discussed in greater detail below with respect to FIGS. 3 and 4.

Driver 219 may receive the digital signal ADC_OUT output by ADC 215 and may comprise any suitable system, device, or apparatus configured to condition such digital signal (e.g., encoding into Audio Engineering Society/European Broadcasting Union (AES/EBU), Sony/Philips Digital Interface Format (S/PDIF)), in the process generating digital output signal DIGITAL_OUT for transmission over a bus to digital processor 109. In FIG. 2, the bus receiving digital output signal DIGITAL_OUT is shown as single-ended. In some embodiments, driver 219 may generate a differential digital output signal 107.

Figure 3:
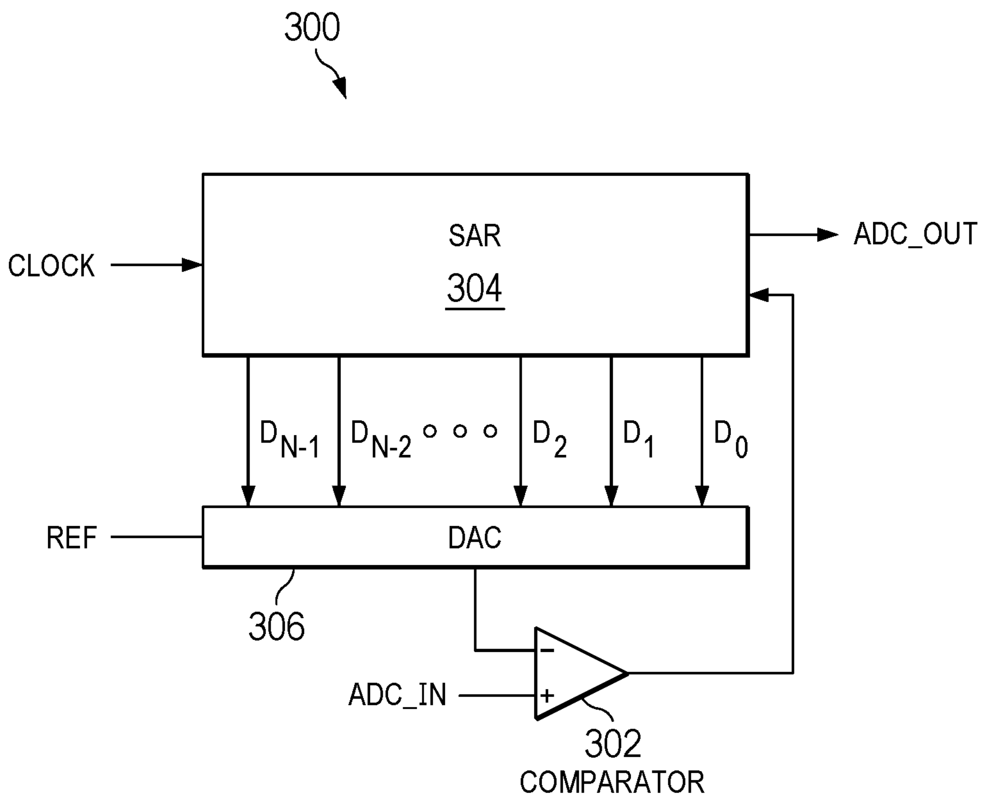
FIG. 3 illustrates a block diagram of selected components of an example SAR ADC, in accordance with embodiments of the present disclosure.

FIG. 3 illustrates a block diagram of selected components of an example SAR ADC 300, in accordance with embodiments of the present disclosure. In some embodiments. SAR ADC 300 may be used to implement ADC 215 shown in FIG. 2. As shown in FIG. 3, SAR ADC 300 may include analog comparator 302, a successive-approximation register (SAR) 304, and an internal reference digital-to-analog converter (DAC) 306.

Analog comparator 302 may comprise any system, device, or apparatus configured to compare analog ADC input signal ADC_IN to the output of internal reference DAC 306 and output the result of the comparison to SAR 304. In some embodiments, analog comparator 302 may include sample-and-hold circuitry (e.g., switches and capacitors) for sampling and holding samples of analog ADC input signal ADC_IN.

SAR 304 may comprise any system, device, or apparatus configured to supply an approximate digital code (e.g., $D_{N-1}$, $D_{N-2}$, . . . , $D_2$, $D_1$, $D_0$) of analog ADC input signal ADC_IN to internal reference DAC 306, as described in greater detail below. Internal reference DAC 306 may comprise any system, device, or apparatus configured to, for comparison with a reference signal REF, supply analog comparator 302 with an analog voltage equivalent to the digital output code.

In operation, SAR 304 may be initialized so that its most significant bit (e,g., $D_{N-1}$) is equal to a digital 1. This code may be output to internal reference DAC 306, which may then supply the analog equivalent of this digital code (e.g., REF/2) from a top plate of a capacitor of DAC 306 to analog comparator 302 for comparison with the sampled analog ADC input signal ADC_IN. If this analog reference voltage exceeds analog ADC input signal ADC_IN, then analog comparator 302 may cause SAR 304 to reset this bit; otherwise, the bit is left as 1. Then the next bit is set to 1 and the same comparison may be performed, continuing this binary search until every bit of SAR 304 has been tested. The resulting code is the digital approximation of sampled analog ADC input signal ADC_IN, which may be output by SAR 304 at the end of the conversion as digital signal ADC_OUT.

Figure 4:
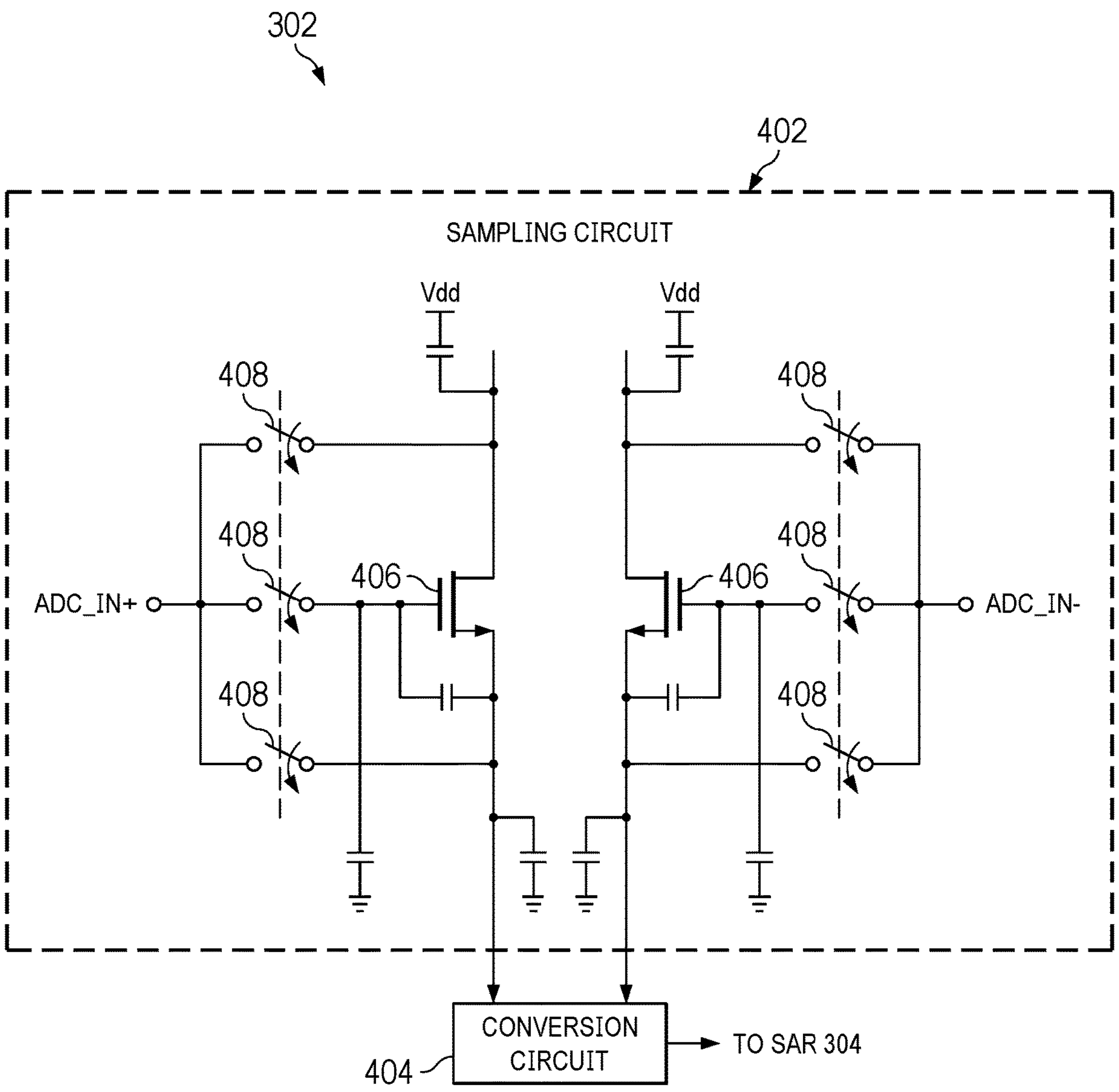
FIG. 4 illustrates a block diagram of selected components of a comparator, in accordance with embodiments of the present disclosure.

FIG. 4 illustrates a block diagram of selected components of comparator 302, in accordance with embodiments of the present disclosure. It is noted that FIG. 4 illustrates comparator 302 as having a differential input configured to receive analog ADC input signal ADC_IN as a differential signal including first polarity $ADC\_IN^+$ and second polarity $ADC\_IN^-$. For purposes of clarity and exposition, FIGS. 2 and 3 do not depict the differential components of analog ADC input signal ADC_IN.

As shown in FIG. 4, comparator 302 may include a sampling circuit 402 and a conversion circuit 404. Sampling circuit 402 may include, among other components (depicted but not labeled with reference numerals in FIG. 4), sampling transistors 406 and sampling switches 408.

Each sampling transistor 406 may comprise any suitable electronic device in which the electrical conductivity between two of its terminals is a function of a voltage applied to its third terminal. For example, as shown in FIG. 4, each sampling transistor 406 may comprise a metal-oxide-semiconductor field-effect transistor (MOSFET) in which the electrical conductivity between its drain and source terminals is a function of a voltage applied to its gate terminal.

As also shown in FIG. 4, individual sampling switches 408 may be coupled between each differential input of comparator 302 and the drain terminal, the gate terminal, and the source terminal of the respective sampling transistor 406 corresponding to the differential input.

In operation, during a sampling phase of comparator 302, sampling switches 408 may be activated (e.g., closed, turned on), sampling the differential components of analog ADC input signal ADC_IN onto the gate terminals, drain terminals, and source terminals of their respective sampling transistors 406. Although not shown for the purposes of clarity and exposition, in some embodiments, sampling switches 408 may also be provided to sample differential components of analog ADC input signal ADC_IN onto the bulk regions of their respective sampling transistors 406.

During a conversion phase of comparator 302, sampling switches 408 may be deactivated (e.g., opened, turned off), thus allowing the samples onto sampling transistors 406 to be held, and allowing conversion circuit 404 to perform further comparison of the sampled signals to reference signal REF and generation of the output signal of comparator 402 to SAR 304. The structure and functionality of conversion circuit 404 is beyond the scope of this disclosure.

Accordingly, during the sampling phase of comparator 302, any change to a voltage on a gate terminal of a sampling transistor 406 is also made to the source and drain terminals of the sampling transistor 406, which may ensure that sampling circuit 402 presents a constant gate-to-source capacitance, gate-to-drain capacitance, drain-to-source capacitance, source-to-bulk capacitance, and drain-to-bulk capacitance to the sampling network across variations in analog ADC input signal ADC_IN. As a result, maintaining linearity of the capacitances upon which analog ADC input signal ADC_IN is sampled, and thus the advantages of top plate sampling for mid- to high-resolution ADCs may be obtained.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. A method for maintaining sampling linearity in a top-plate sampled comparator, comprising:

pre-conditioning the comparator by maintaining a constant voltage across non-linear capacitors of the comparator during a sampling phase of the comparator, wherein the non-linear capacitors comprise parasitic capacitances of an input device of the comparator, and wherein maintaining the constant voltage comprises coupling an analog input signal of the comparator to a gate, a drain, and a source of the input device of the comparator during the sampling phase such that voltages across the parasitic capacitances of the input device are held substantially constant during the sampling phase.

2. The method of claim 1, wherein maintaining the constant voltage across non-linear capacitors of the comparator during a sampling phase of the comparator comprises sampling an analog input signal to the comparator onto all terminals of an input device of the comparator.

3. The method of claim 1, wherein maintaining the constant voltage across non-linear capacitors of the comparator during a sampling phase of the comparator comprises coupling non-input terminals of an input device of the comparator to an input of the comparator.

4. The method of claim 1, wherein maintaining the constant voltage across non-linear capacitors of the comparator during a sampling phase of the comparator comprises coupling all terminals of an input device of the comparator to a top plate of a reference digital-to-analog converter of a successive approximation register analog-to-digital converter.

5. A top-plate sampled comparator comprising:

sampling transistors;

sampling switches;

non-linear capacitors comprising parasitic capacitances of an input device of the comparator; and circuitry configured to pre-condition the comparator by maintaining a constant voltage across the parasitic capacitances of the input device of the comparator during a sampling phase of the comparator in order to maintain sampling linearity of the comparator, wherein the circuitry is configured to maintain the constant voltage by coupling an analog input signal of the comparator to a gate, a drain, and a source of the input device of the comparator during the sampling phase such that voltages across the parasitic capacitances of the input device are held substantially constant during the sampling phase.

6. The top-plate sampled comparator of claim 5, wherein maintaining the constant voltage across non-linear capacitors of the comparator during a sampling phase of the comparator comprises sampling an analog input signal to the comparator onto all terminals of an input device of the comparator.

7. The top-plate sampled comparator of claim 5, wherein maintaining the constant voltage across non-linear capacitors of the comparator during a sampling phase of the comparator comprises coupling non-input terminals of an input device of the comparator to an input of the comparator.

8. The top-plate sampled comparator of claim 5, wherein maintaining the constant voltage across non-linear capacitors of the comparator during a sampling phase of the comparator comprises coupling all terminals of an input device of the comparator to a top plate of a reference digital-to-analog converter of a successive approximation register analog-to-digital converter.

9. A successive approximation register analog-to-digital converter comprising:

a reference digital-to-analog converter;

a successive approximation register; and a top-plate sampled comparator configured to compare a reference signal generated by the reference digital-to-analog converter to an analog input signal in order to generate a comparator output to the successive approximation register, the comparator comprising:

sampling transistors;

sampling switches;

non-linear capacitors comprising parasitic capacitances of an input device of the comparator; and circuitry configured to pre-condition the comparator by maintaining a constant voltage across the parasitic capacitances of the input device capacitors of the comparator during a sampling phase of the comparator in order to maintain sampling linearity of the comparator, wherein the circuitry is configured to maintain the constant voltage by coupling the analog input signal to a gate, a drain, and a source of the input device of the comparator during the sampling phase such that voltages across the parasitic capacitances of the input device are held substantially constant during the sampling phase.

10. The successive approximation register analog-to-digital converter of claim 9, wherein maintaining the constant voltage across non-linear capacitors of the comparator during a sampling phase of the comparator comprises sampling an analog input signal to the comparator onto all terminals of an input device of the comparator.

11. The successive approximation register analog-to-digital converter of claim 9, wherein maintaining the constant voltage across non-linear capacitors of the comparator during a sampling phase of the comparator comprises coupling non-input terminals of an input device of the comparator to an input of the comparator.

12. The successive approximation register analog-to-digital converter of claim 9, wherein maintaining the constant voltage across non-linear capacitors of the comparator during a sampling phase of the comparator comprises coupling all terminals of an input device of the comparator to a top plate of a reference digital-to-analog converter of a successive approximation register analog-to-digital converter.

13. The successive approximation register analog-to-digital converter of claim 9, wherein the parasitic capacitances of the input device comprise a gate-to-source capacitance, a gate-to-drain capacitance, a drain-to-source capacitance, a source-to-bulk capacitance, and a drain-to-bulk capacitance of a sampling transistor of the comparator.

14. The method of claim 1, wherein the parasitic capacitances of the input device comprise a gate-to-source capacitance, a gate-to-drain capacitance, and a drain-to-source capacitance of a sampling transistor of the comparator.

15. The top-plate sampled comparator of claim 5, wherein the parasitic capacitances of the input device comprise a gate-to-source capacitance, a gate-to-drain capacitance, a drain-to-source capacitance, a source-to-bulk capacitance, and a drain-to-bulk capacitance of a sampling transistor of the comparator.

* * * * *